(12) United States Patent
Matsuda

(10) Patent No.: US 6,818,940 B2
(45) Date of Patent: Nov. 16, 2004

(54) INSULATED GATE BIPOLAR TRANSISTOR HAVING TRENCH GATES OF RECTANGULAR UPPER SURFACES WITH DIFFERENT WIDTHS

(75) Inventor: Tadashi Matsuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/821,956

(22) Filed: Apr. 12, 2004

(65) Prior Publication Data

US 2004/0188803 A1 Sep. 30, 2004

Related U.S. Application Data

(63) Continuation of application No. 10/298,514, filed on Nov. 19, 2002, now Pat. No. 6,777,783.

(30) Foreign Application Priority Data

Dec. 26, 2001 (JP) ........................................ 2001-393722

(51) Int. Cl.[7] ............................................. H01L 27/108
(52) U.S. Cl. ........................ 257/302; 257/263; 257/328; 257/329; 257/330; 257/331; 257/332
(58) Field of Search ................................. 257/328–332, 257/302

(56) References Cited

U.S. PATENT DOCUMENTS 5,329,142 A   7/1994   Kitagawa et al.

OTHER PUBLICATIONS

Mitsuhiko Kitagawa, et al., "A 4500 V Injection Enhanced Insulated Gate Bipolar Transistor (IEGT) Operating In a Mode Similar To a Thyristor", IEDM Technical Digest, International Electron Devices Meeting, Dec. 5–8, 1993, pp. 679–682.

Primary Examiner—Fetsum Abraham
(74) Attorney, Agent, or Firm—Oblon, Spivak, McClelland, Maier & Neustadt, P.C.

(57) ABSTRACT

An insulated gate bipolar transistor includes a first semiconductor layer of a first conductivity type, a second semiconductor layer of a second conductivity type formed on a top surface of the first semiconductor layer, a base layer of the first conductivity type formed on a top surface of the second semiconductor layer, a plurality of gate electrodes each of which is buried in a trench with a gate insulation film interposed therebetween, the trench being formed in the base layer to a depth reaching said second semiconductor layer from a surface of the base layer, each the gate electrode having an upper surface of a rectangular pattern with different widths in two orthogonal directions, the gate electrodes being disposed in a direction along a short side of the rectangular pattern, and emitter layers of the second conductivity type formed in the surface of the base layer to oppose both end portions of each the gate electrode in a direction along a long side of the rectangular pattern.

5 Claims, 15 Drawing Sheets

(A)

CARRIER CONCENTRATION

INSULATED GATE BIPOLAR TRANSISTOR HAVING TRENCH GATES OF RECTANGULAR UPPER SURFACES WITH DIFFERENT WIDTHS

CROSS-REFERENCE TO RELATED APPLICATION

This application is a con of Ser. No. 10/398,514 filed Nov. 19, 2002 now U.S. Pat. No. 6,777,783 which is based upon and claims the benefit of priority from the prior Japanese Patent Application No. 2001-393722, filed on Dec. 26, 2001, the entire content of which is incorporated herein by reference.

BACKGROUND OF THE INVENTION

1. Field of the Invention

This invention relates generally to power semiconductor devices and, more particularly, to an insulated gate bipolar transistor (referred to as "IGBT" hereinafter).

2. Description of Related Art

Traditionally, IGBTs are known as power semiconductor devices with low losses. IGBTs include those of the so-called trench gate type. These trench-gate IGBTs are becoming more important in industrial applications due to their advantages over old or classical IGBTs of the planar gate type. One important advantage lies in the ability to obtain lower channel resistances by integration of a great number of highly miniaturized or "micro" unit cells on a chip. Another advantage is the ability to obtain low on-voltage characteristics. This is resulted from the absence of any pinch-off otherwise occurring due to unwanted formation of parasitic junction field effect transistors ("JFETs"). The trench-gate IGBTs are principally free from the risk of such parasitic JFETs owing to the inherent structures thereof.

A plan view of one prior known trench-gate IGBT is shown in FIG. 15. A cross-sectional view of this IGBT as taken along line I-I' is depicted in FIG. 16. A lightly-doped n (n$^-$) type layer 2 is formed on a heavily-doped p (p$^+$) type silicon substrate 1. On a surface of this n$^-$-type layer 2, a p-type base layer 3 is formed by diffusion to a depth of approximately 4 micrometers ($\mu$m). Further, an n$^+$-type emitter layer 4 with a depth of about 0.5 $\mu$m is selectively diffusion-formed in a surface of the base layer 3.

Trenches 5 are formed to penetrate the emitter layer 4 and the base layer 3 in such a manner that each trench has a width of about 1 $\mu$m and a depth of 6 to 7 $\mu$m, wherein gate electrodes 6 are buried within these trenches 5. A cathode electrode (emitter electrode) 7 is formed to be in contact with the base layer 3 and the emitter layer 4. An anode electrode (collector electrode) 8 is formed on a back surface of the Si substrate 1.

In this trench-gate IGBT, a plurality of unit cells are arrayed and formed with a surface portion of a region laterally disposed between adjacent ones of the plurality of lines of gate electrodes 6 as a cathode region of each unit cell. In the example of FIG. 15 and FIG. 16, a cathode region width D2 which occupies a width D1 of unit cell is great.

With such prior art IGBT, the carrier distribution at a position Y-Y' of FIG. 16 at an on-time is as indicated by a broken line in FIG. 19, wherein the carrier density near a cathode (K) side surface is lower than that near an anode (A) side surface. This becomes a bar to reduction of the IGBT's on-voltage at substantially the same level as thyristors. If it is possible to increase the carrier density near the cathode side surface, then it becomes expectable to achieve a lower on-voltage of the IGBT than ever before.

FIGS. 17 and 18 show an example in which the cathode region width D2 occupying the width D1 of a unit cell is lessened by enlarging the width of each trench, in comparison with the IGBT of FIGS. 15 and 16. With the use of such structure, the passage of a hole current which is injected from the p$^+$-type substrate (anode) 1 into the n$^-$-type layer 2 and then flows on the cathode side in a turn-on event becomes narrowed, resulting in occurrence of accumulation or storage of holes at or near the cathode side surface. The result of this is that the carrier distribution at the Y-Y' position becomes as indicated by a solid line in FIG. 19: the carrier density near the cathode region surface gets higher. Further, with an increase in this hole density, electron injection takes place from the cathode into the device interior in order to satisfy the carrier neutralization condition. Since an electron current from the cathode to the anode flows in a channel region which is controlled by the gate electrode 6, there is no appreciable resistance increase otherwise occurring due to the narrowing of the cathode region width D2.

As apparent from the foregoing, it is possible to lower the IGBT on-voltage to almost the same level of that of thyristors through optimization of the trench gate width, the cathode region width, and further the trench gate depth and the like. This has already been reported in, for example, U.S. Pat. No. 5,329,142 or IEDM Technical Digest 1993, pp. 679–682. The resultant IGBT with its on-voltage lowered by the use of the above-stated technique is specifically called the carrier injection enhanced gate bipolar transistor (IEGT) in some cases.

As previously stated, widening the trench gate width for achievement of a lower on-voltage would result in occurrence of several disadvantages. For example, in order to bury a polycrystalline silicon (polysilicon) gate electrode in a trench with a width of about 10 $\mu$m, a need is felt to deposit a polysilicon which is about 5-$\mu$m thick. Thus, the manufacturing or fabrication efficiency decreases. Also note that when such polysilicon is buried in a large volume of trench, large stress is applied to the trench region. This can cause crystal defects at trench edges, which leads to a decrease in reliability and a decrease in production yields due to current leakage or else.

SUMMARY OF THE INVENTION

An insulated gate bipolar transistor includes a first semiconductor layer of a first conductivity type, a second semiconductor layer of a second conductivity type formed on a top surface of the first semiconductor layer, a base layer of the first conductivity type formed on a top surface of the second semiconductor layer, a plurality of gate electrodes each of which is buried in a trench with a gate insulation film interposed therebetween, the trench being formed in the base layer to a depth reaching the second semiconductor layer from a surface of the base layer, each the gate electrode having an upper surface of a rectangular pattern with different widths in two orthogonal directions, the gate electrodes being disposed in a direction along a short side of the rectangular pattern, emitter layers of the second conductivity type formed in the surface of the base layer to oppose both end portions of each the gate electrode in a direction along a long side of the rectangular pattern, a first main electrode in contact with the emitter layers and the base layer, and a second main electrode formed at a bottom surface of the first semiconductor layer.

DETAILED DESCRIPTION OF THE INVENTION

Figure 1:
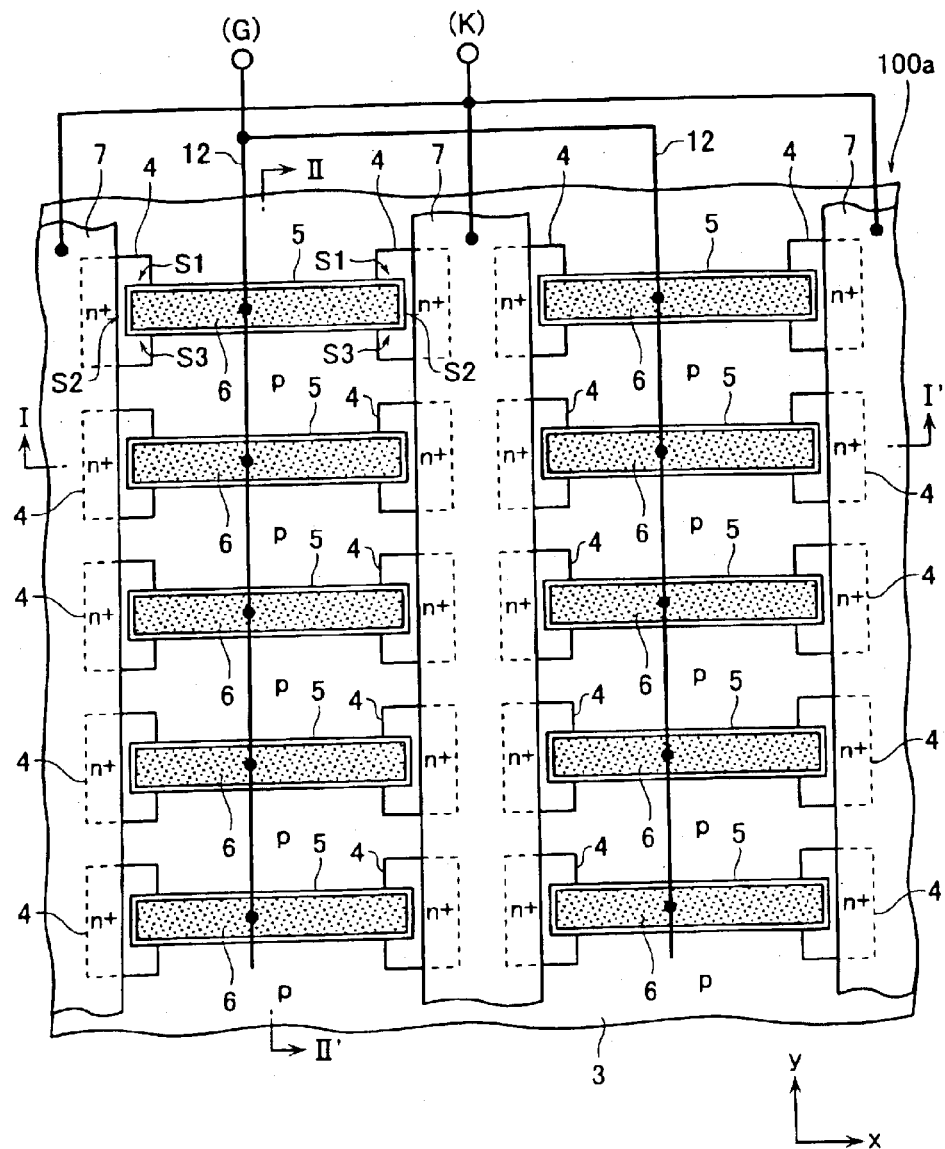
FIG. 1 is a diagram showing a plan view of main part of an IGBT 100a in accordance with an embodiment of this invention.

Several illustrative embodiments of this invention will be explained with reference to the accompanying figures of the drawing below.

Embodiment 1

Figure 2:
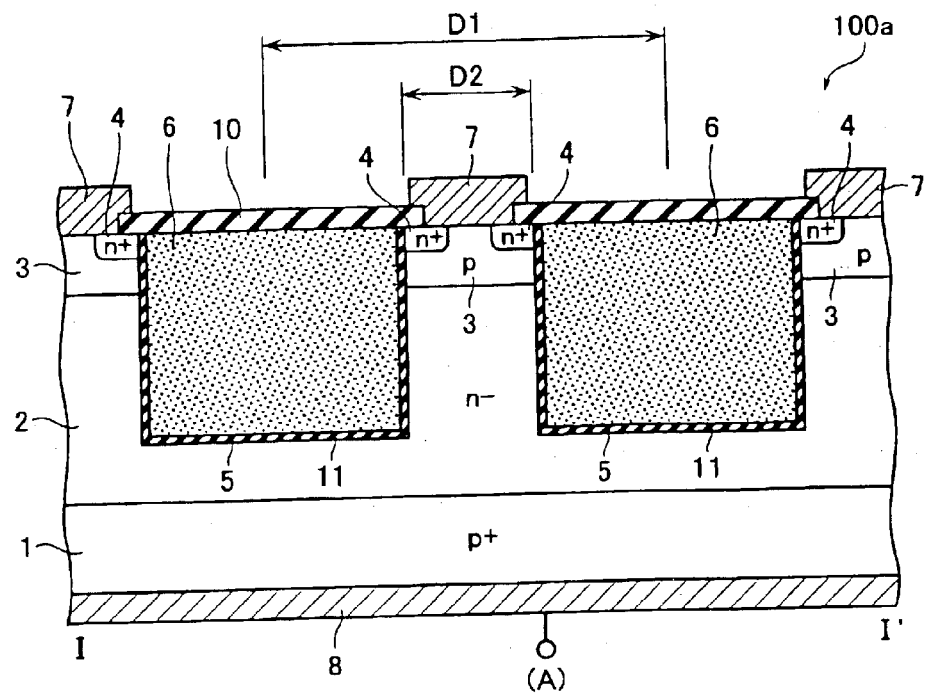
FIG. 2 is a diagram showing a cross-sectional view of the IGBT as taken along line I-I' of FIG. 1.
Figure 3:
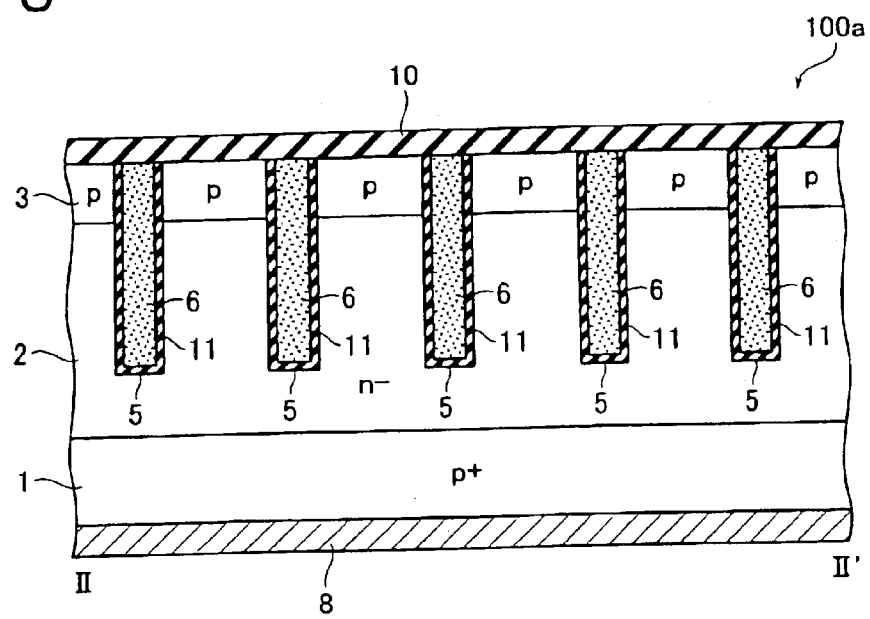
FIG. 3 is a showing a sectional view of the IGBT along line II-II' of FIG. 1.

Referring to FIG. 1, there is illustrated a plan view of main part of an IGBT 100a in accordance with one embodiment of the invention. Cross-sectional views of the IGBT 100a as taken along lines I-I' and II-II' are depicted in FIGS. 2 and 3, respectively. As shown herein, a heavily-doped p ($p^+$) type silicon substrate (anode emitter layer) 1 has its top surface on which a lightly-doped n ($n^-$) type layer (n base layer) 2 is formed to have an electrical resistivity of 50 Ω cm or more. Formed in its surface is a p-type base layer 3 with a depth of approximately 4 micrometers ($\mu$m). Trench-like grooves 5 are defined to penetrate the p-base layer 3 while having a depth reaching the n-base layer 2. In each trench 5, a gate electrode 6 is insulatively buried with a gate insulation film 11 interposed therebetween. This gate electrode 6 will be referred to hereinafter as "insulated trench gate"-or simply "trench gate" in the rest of the description.

As shown in FIG. 1, the insulated trench gate 6 is such that its upper surface shape has a long narrow or "slender" rectangular pattern with opposite long sides and short sides. In its short side direction (i.e. "y"-direction), a plurality of insulated trench gates 6 are arrayed and aligned at a predetermined pitch. The illustrative trench gates 6 are such that a plurality of ones are laid out along the long side direction ("x"-direction) thereof also; for example, at least two columns are disposed as shown in FIG. 1. In a surface of the p-base layer 3, $n^+$-type emitter layers (cathode emitter layers) 4 with a depth of about 0.5 $\mu$m are formed in such a manner as to oppose three side faces S1, S2, S3 of each of the both end portions of the respective insulated trench gates 6 in the long side direction. In other words, the individual trench gate 6 is associated at its opposite edges with two separate cathode-emitter "islands" 4, each of which opposes three side faces S1–S3 of a corresponding gate edge.

The surface on which the p-base layer 3 and the cathode emitter layers 4 plus gate electrodes 6 are formed is covered with an electrically insulative or dielectric film 10. Then, at selected locations between the gate arrays in the x-direction (i.e. gate rows), contact openings or holes are defined in the dielectric film 10. Next, parallel elongate emitter electrodes (cathode electrodes) 7 are formed so that each is in contact with two neighboring cathode emitter layers 4 in the x-direction and a surface portion of the p-base layer 3 which is exposed therebetween. A respective one of the cathode electrodes 7 is formed into a stripe-like shape which continues in the y-direction in such a way as to commonly connect together a plurality of cathode emitter layers 4 aligned in the y-direction. A collector electrode (anode electrode) 8 is formed on a bottom or back surface of the substrate 1.

Figure 4:
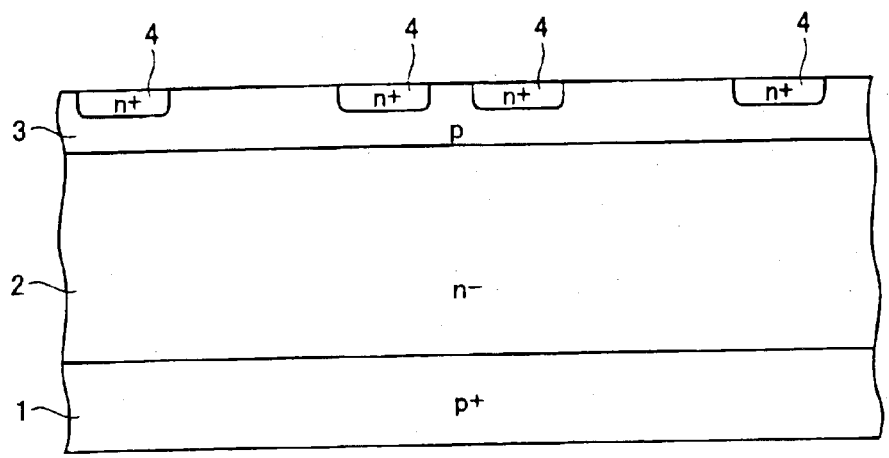
FIG. 4 is a sectional diagram for explanation of one major process step in the formation of a pnpn structure of the IGBT.

The IGBT 100a of this embodiment is fabricated in the way which follows. Firstly, as shown in FIG. 4, on the $p^+$-type silicon substrate 1, an $n^-$ layer 2 with its resistivity of 50 Ω cm or greater is formed by epitaxial growth to a thickness of about 100 $\mu$m, by way of example. Next, the $n^-$-type layer 2 is doped or implanted boron ions at its surface. The boron thus implanted is then diffused to a depth of about 4 $\mu$m to thereby form a p-base layer 3. Further, arsenic is selectively ion-implanted into a surface of the p-base layer 3; then the dopant is diffused to a depth of about 0.5 $\mu$m, thus forming a plurality of $n^+$-type emitter layers 4 each having an area of about 2 square micrometers ($\mu m^2$)

Figure 5:
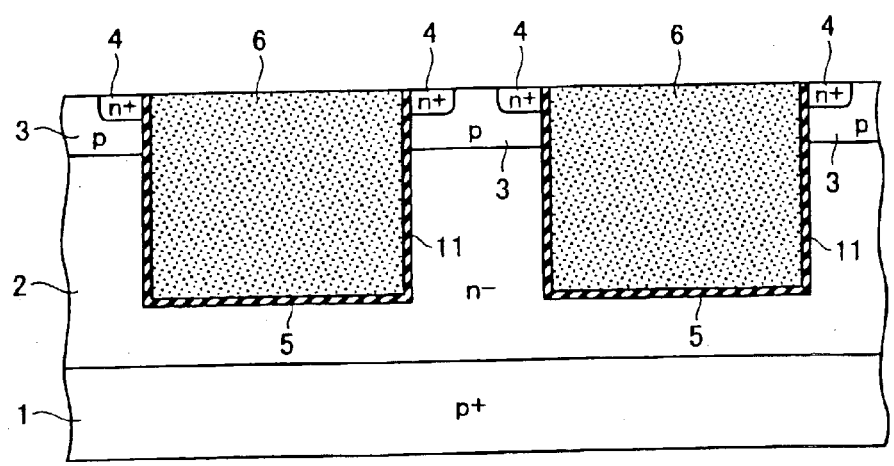
FIG. 5 is a sectional diagram for explanation of a process step in the formation of trench gates of the IGBT.

Subsequently as shown in FIG. 5, form trenches 5 each of which has a rectangular plan view shape with about 1 $\mu$m width along the short side direction and about 10 $\mu$m length along the long side direction, and has a depth of about 7 $\mu$m. Each trench 5 extends in the long side direction into two $n^+$-emitter layers 4 in such a manner that each end portion thereof overlaps the emitter layer 4 by about 1 $\mu$m. On the inner surface of each trench 5, a gate insulator film 11 is formed by thermal oxidation to a thickness of about 0.1 $\mu$m. Then, a chemical vapor deposition (CVD) method is used to deposit a polysilicon film to a thickness of about 0.5 $\mu$m to thereby bury the inside of trench 5. Thereafter, apply etchback treatment to the polysilicon by reactive ion etching (RIE) techniques, thus planarizing its surface. Whereby, the intended insulated trench gates 6 are obtained.

Thereafter, cover or coat the substrate surface with a dielectric film 10. Then, define contact holes in the film 10. Next, form cathode electrodes 7 by evaporation or sputtering of aluminum (Al). On the back surface of Si substrate 1, form an anode electrode 8 by deposition of a vanadium-nickel-gold (V—Ni—Au) film.

Although not specifically discussed in the explanation above, it should be required that the plurality of insulated trench gates 6 be common-connected together and taken out toward a gate electrode node (G). More specifically, as shown in FIG. 1 in a modelized fashion, a pattern of on-chip interconnect lead wires 12 is required for electrical connection of the plurality of trench gates 6. This gate lead pattern 12 may be formed by use of the same metal layer as the cathode electrodes 7 or alternatively a metal layer different therefrom.

Figure 16:
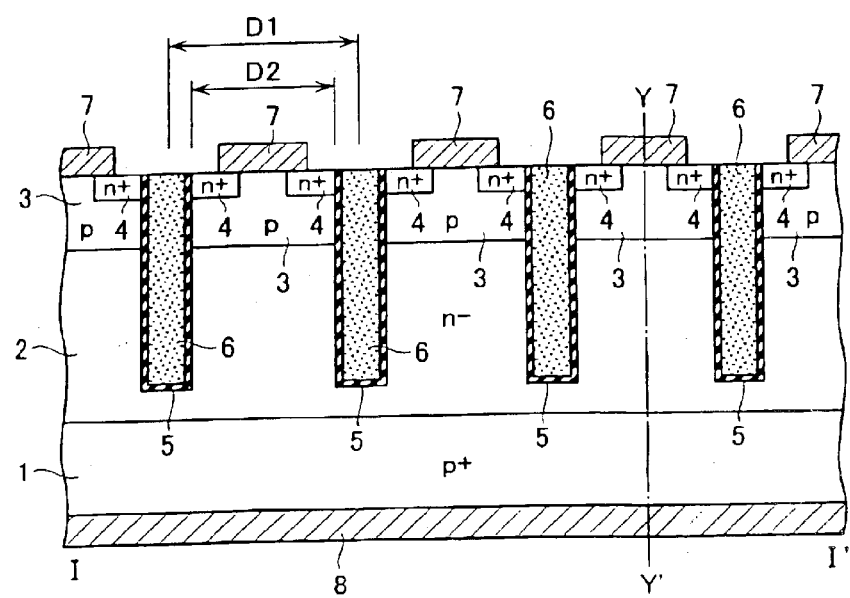
FIG. 16 is a sectional diagram along line I-I' of FIG. 15.
Figure 18:
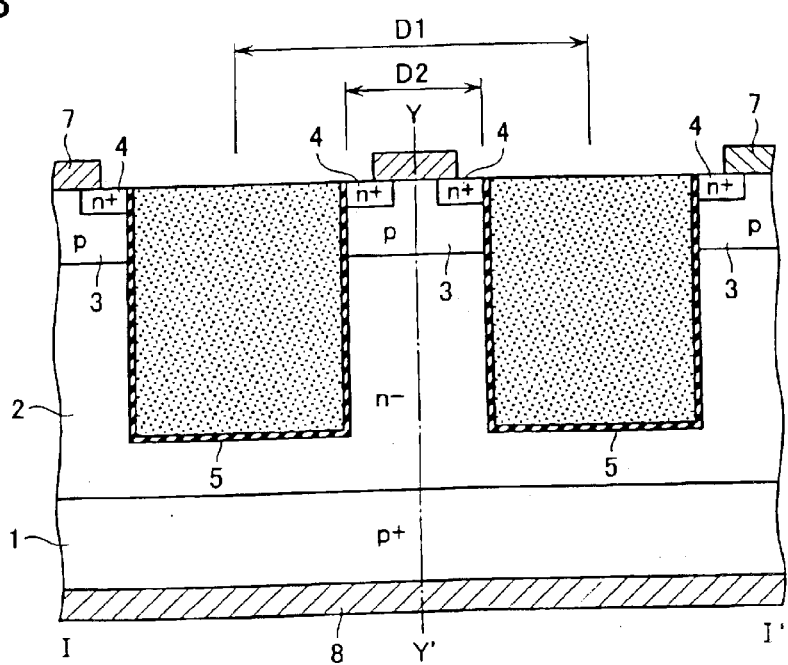
FIG. 18 is a sectional diagram along line I-I' of FIG. 17.
Figure 19:
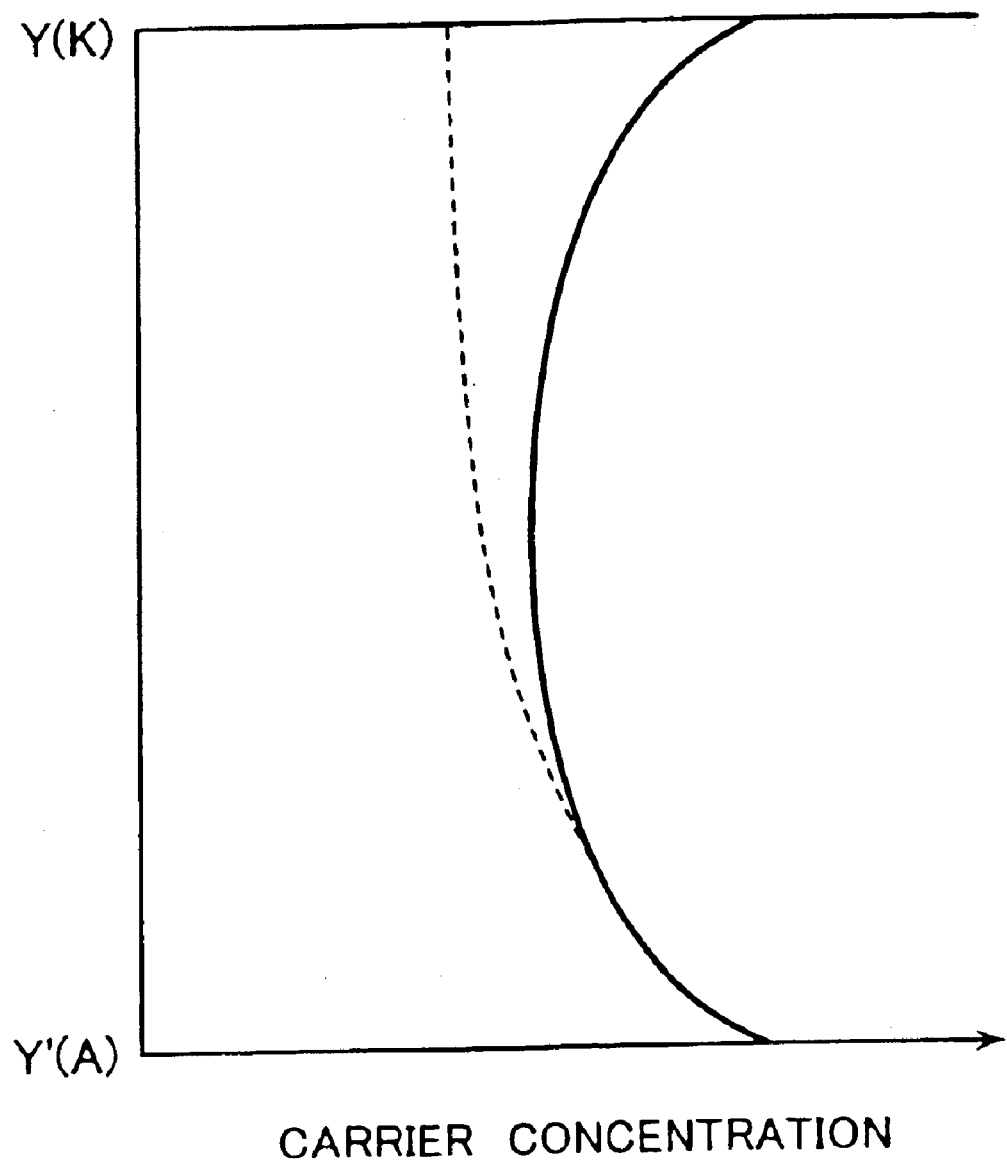
FIG. 19 is a graph showing the carrier distribution upon turn-on of the prior art IGBTS.

The IGBT 100a of this embodiment is substantially similar to the prior art of FIG. 18 as far as its x-directional cross-section of FIG. 2 is concerned. More specifically, the trench gate width is designed so that it is greater than the cathode region width. The result of this is that when compared to the structure shown in FIG. 16, the cathode region width D2 occupying the unit cell width D1 becomes smaller. With such an arrangement, it is possible to increase the carrier density at or near the cathode side surface in turn-on events, which in turn makes it possible to obtain a low on-voltage.

Figure 15:
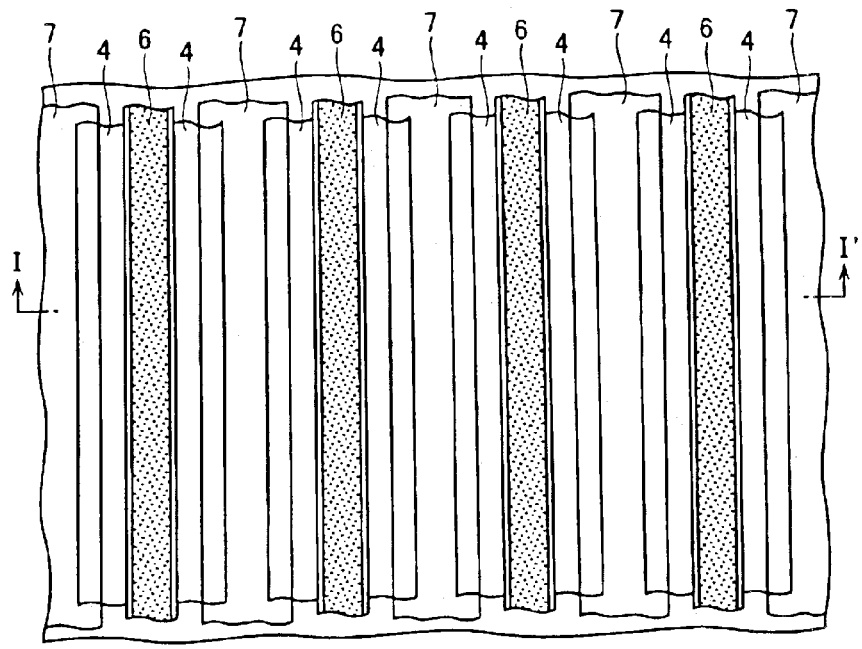
FIG. 15 is a plan view diagram of a prior art IGBT.
Figure 17:
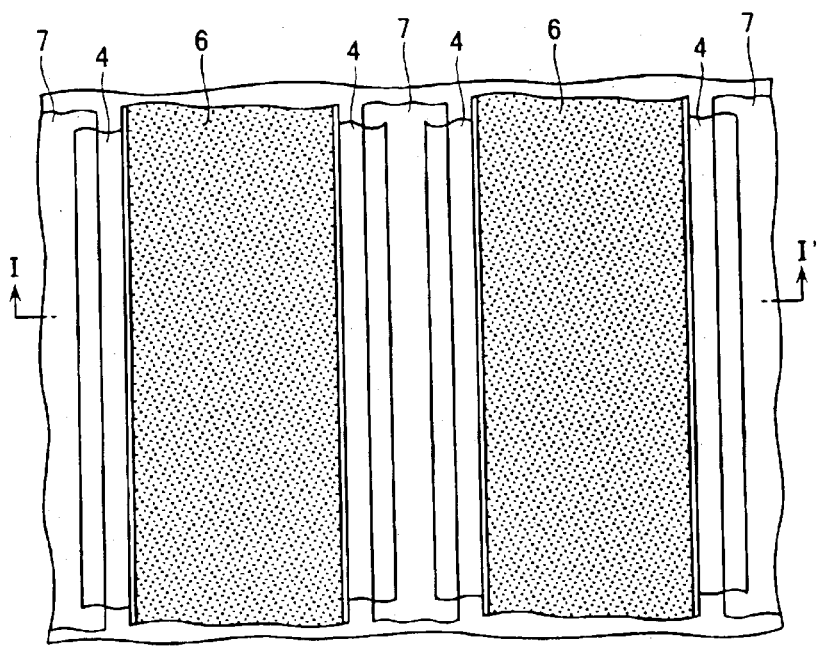
FIG. 17 is a plan view of an improved version of IGBT in the prior art.

In the case of this embodiment, unlike the prior art of FIG. 15 or FIG. 17, the trench gates 6 and their associative cathode emitter layers 4 are subdivided into a plurality of ones in the y-direction. Due to this, the resulting channel width is virtually seen to become smaller than that of the IGBT of FIG. 15 or 17. However, since the both end portions of each trench gate 6 is formed in the state that these overlap the cathode emitter layers 4 as described previously, the individual cathode emitter layer 4 opposes three side faces S1, S2, S3 of each end portion of trench gate 6, with the channel being formed beneath it. For instance, when the y-direction width of trench gate 6 is set at 1am while letting the overlap relative to a cathode emitter layer 4 measure 1 µm as in the numerical value setup example stated supra, a channel width of 3 µm is made available at each end portion of a single trench gate 6. Accordingly, optimizing the width and layout pitch of trench gates 6 makes it possible to obtain the required channel width which is almost equivalent to the prior art. In other words, it is possible to obtain the intended current capacity that is much similar to that of the prior art IGBTs.

And in this embodiment, the trench gates 6 shown in FIGS. 17 and 18 are modified so that each is divided into a plurality of segments or "islands" in the y-direction, with the width of each trench lessened. Consequently, the deposition of a thick polysilicon film such as in the examples of FIGS. 17 and 18 is no longer required for the purpose of burying the gate electrodes. Thus, any possible decrease in fabrication efficiency otherwise occurring due to an increase in deposited film thickness is avoided. Further, as the capacity of a single trench stays less, the stress applied to such trench becomes smaller, leading to improvements in reliability and production yields. In addition, since this embodiment is arranged so that the cathode emitter layers 4 are formed at the both ends or edges of each trench gate while being individually separated from each other, the area of an NPNP thyristor that is not devoted to the IGBT operation stays small while offering enhanced latch-up withstanding abilities or robustness.

Although in this embodiment the rectangular upper-surface pattern of insulated trench gates is designed to measure 1 µm in the short side direction and 10 µm in the long side direction, their optimal values may differ depending upon a withstand or breakdown voltage system used. An example is that in the device of a 1,200-V high power rating system, optimal values are 1 µm in the short side direction and 16 µm in the long side direction. Optionally, the short-side width can be further lessened under the condition which enables formation of trenches while offering an ability to bury a polysilicon film successfully.

Several other illustrative embodiments will be explained below. In the embodiments below, parts or components corresponding to those of the embodiment 1 are denoted by the same or similar reference characters to those of Embodiment 1, with any detailed explanations thereof eliminated.

Embodiment 2

Figure 6:
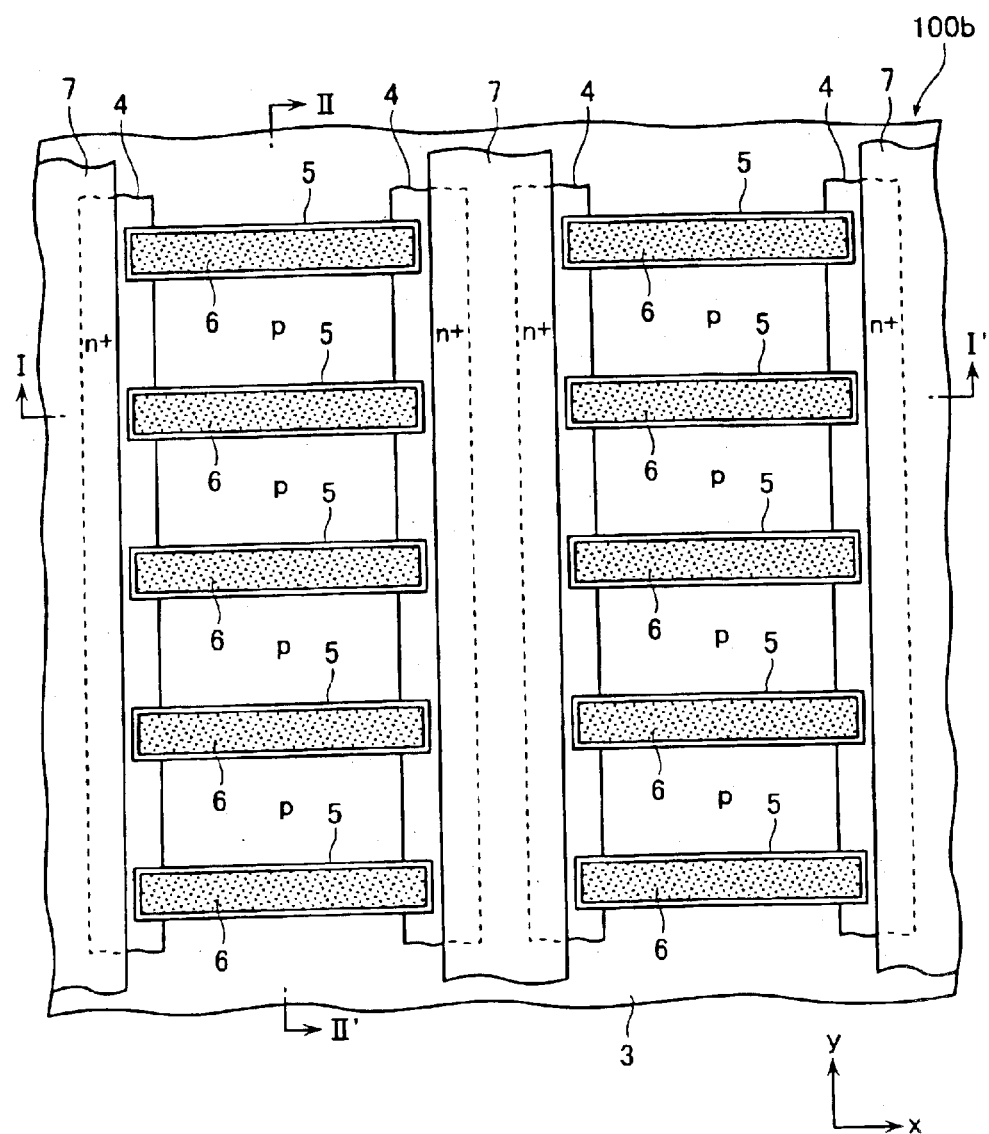
FIG. 6 is a plan view diagram of main part of an IGBT 100b in accordance with another embodiment of the invention.

An IGBT 100b in accordance with Embodiment 2 of the invention is shown in FIG. 6, which shows a plan view of main part thereof. The IGBT 100b's cross-sections along lines I-I' and II-II' are the same as those shown in FIGS. 2 and 3. Embodiment 2 is different from Embodiment 1 in the shape of cathode emitter layers 4. More specifically, the cathode emitter layers 4 are formed at both end portions of insulated trench gates 6 as impurity-doped diffusion layers, each of which integrally extends or "continues" between adjacent ones of the plurality of insulated trench gates 6 aligned in the y-direction in a similar manner to the cathode electrodes 7. It is similar to Embodiment 1 that cathode emitter layers 4 oppose three side faces of each trench gate end portion.

With such a structure, similar effects to those of Embodiment 1 are obtainable. Moreover, it is possible to increase manufacturing or fabrication margins. This can be said because the strictness of position alignment accuracy relative to the cathode emitter layers 4 is relieved or "relaxed" in the formation of the trenches 5.

Embodiment 3

Figure 7:
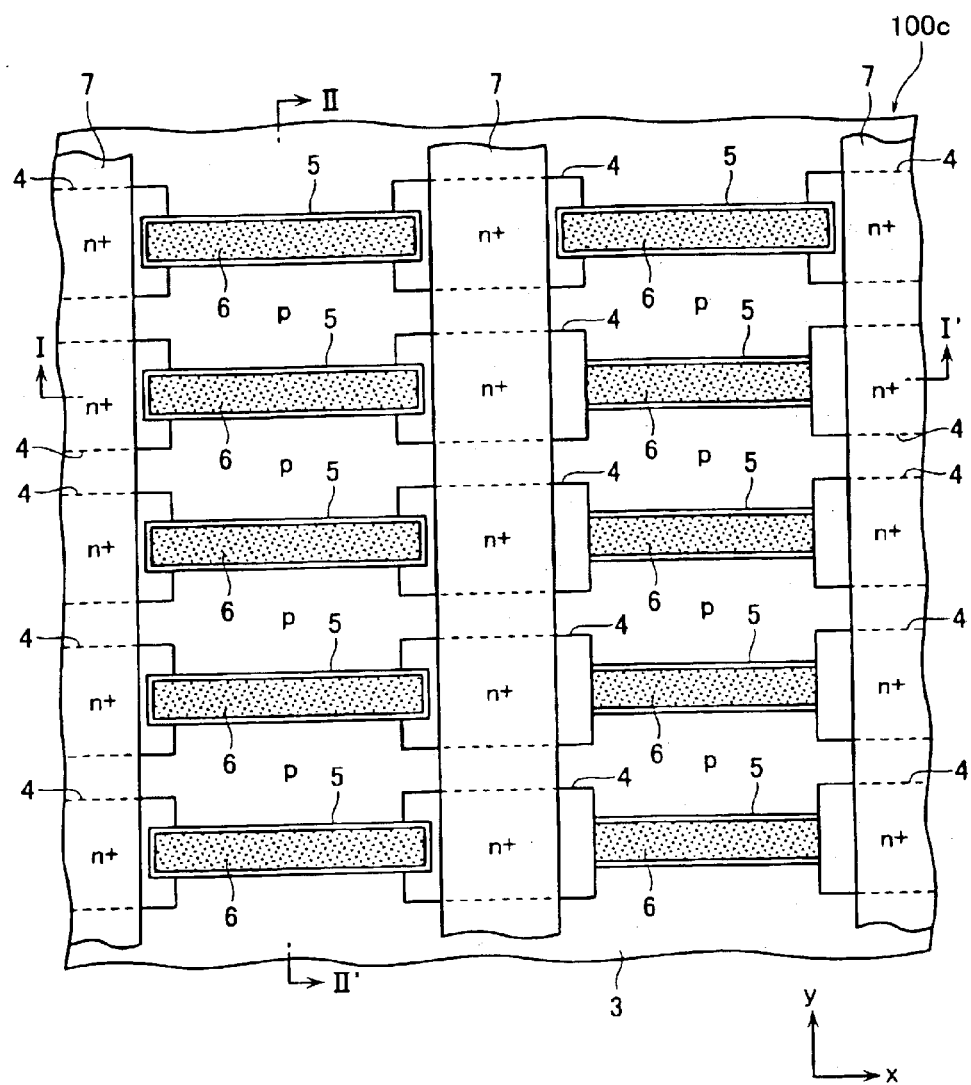
FIG. 7 is a plan view diagram of main part of an IGBT 100c in accordance with still another embodiment of the invention.
Figure 8:
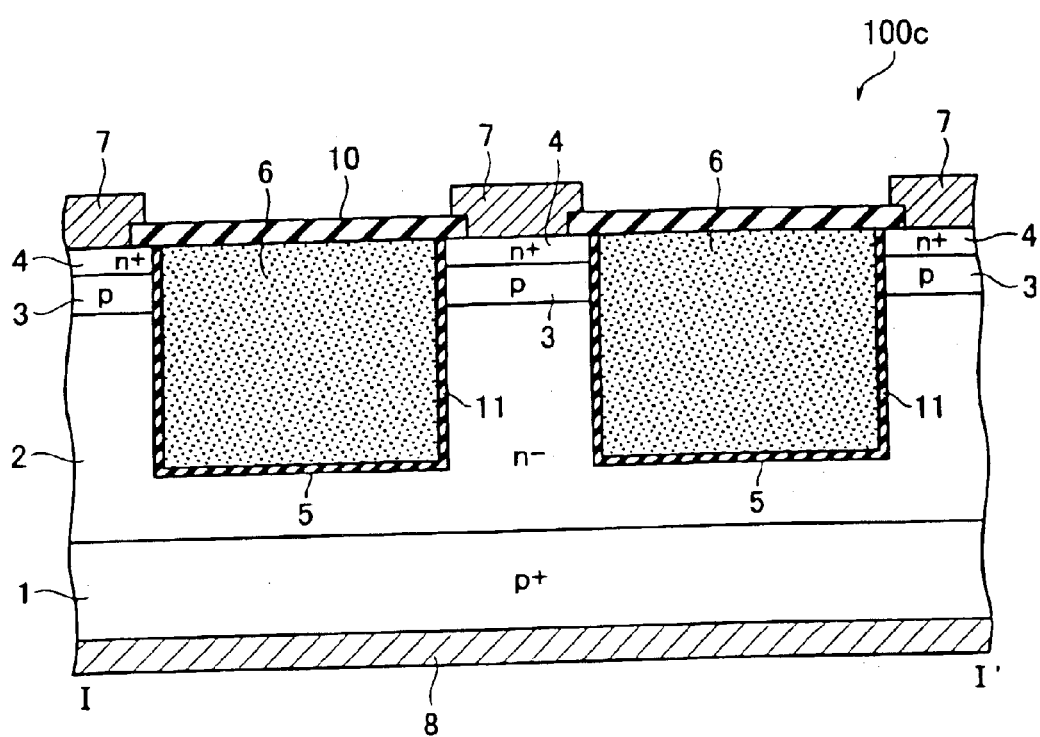
FIG. 8 is a sectional diagram along line I-I' of FIG. 7.

A plan view of main part of an IGBT 10c in accordance with Embodiment 3 is shown in FIG. 7. A sectional view along line I-I' is shown in FIG. 8. Its II-II' cross-section is the same as that of FIG. 3. In this embodiment, the cathode emitter layers 4 are arranged so that adjacent ones are formed as a single "combined" cathode emitter layer 4 which continues between two neighboring insulated trench gates 6 in the x-direction and is commonly owned or "shared" by the two insulated trench gates 6. Embodiment 3 is similar to Embodiment 1 in that the cathode emitter layers 4 oppose three side faces of each trench gate end portion. Contacts of cathode electrodes 7 with the p-base layer 3 are at portions between cathode emitter layers 4 which are formed discontinuously in a "quantized" fashion in the y-direction.

With the use of such structure, similar effects are obtainable to those of Embodiment 1. In addition, it is possible to increase fabrication margins because the strictness of position alignment accuracy relative to the cathode emitter layers 4 is relaxed in the formation of the trenches 5.

Embodiment 4

Figure 9:
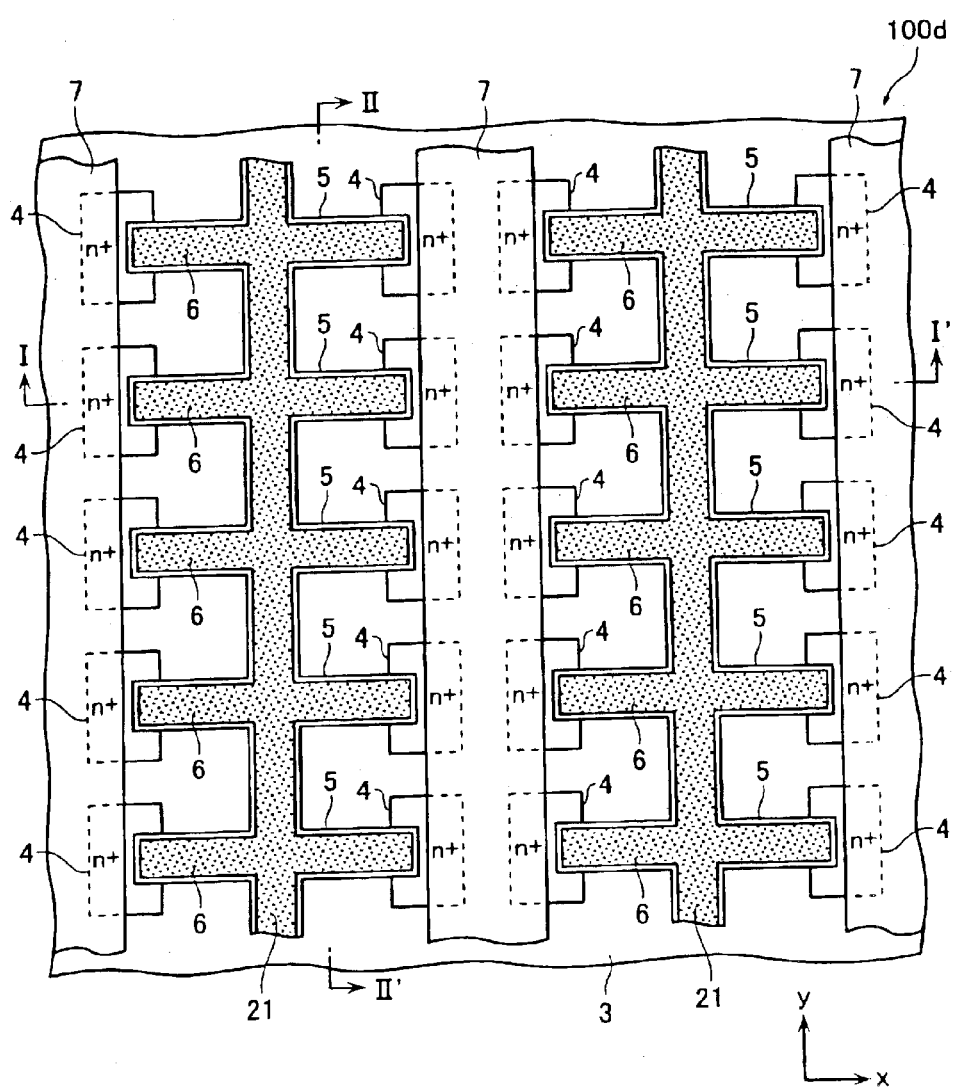
FIGS. 9 through 14 are diagrams depicting plan views of main parts of IGBTs 100d to 100i in accordance with further embodiments of the invention.

Turning to FIG. 9, a plan view of main part of an IGBT 100d in accordance with Embodiment 4 is shown. Its I-I' and II-II' cross-sections are the same as those shown in FIGS. 2 and 3. The cathode emitter layers 4 are the same as those of Embodiment 1. In this embodiment, a coupling section 21 is provided for coupling together a plurality of cathode emitter layers 4 which are arrayed in the y-direction at their central portions along the longitudinal or elongate direction thereof. The coupling section 21 is the same in structure as the insulated trench gates 6 and is manufacturable by the same process and thus functions as the gate wiring lead 12 shown in FIG. 1 for interconnection of multiple trench gates 6. To reduce the electrical resistance of the gate lead, it is also effective to form a metal wiring lead which overlies this coupler section 21.

This structure is similar to Embodiment 1 except that coupler sections 21 are provided; thus, similar effects to those of Embodiment 1 are obtainable.

Embodiment 5

Figure 10:
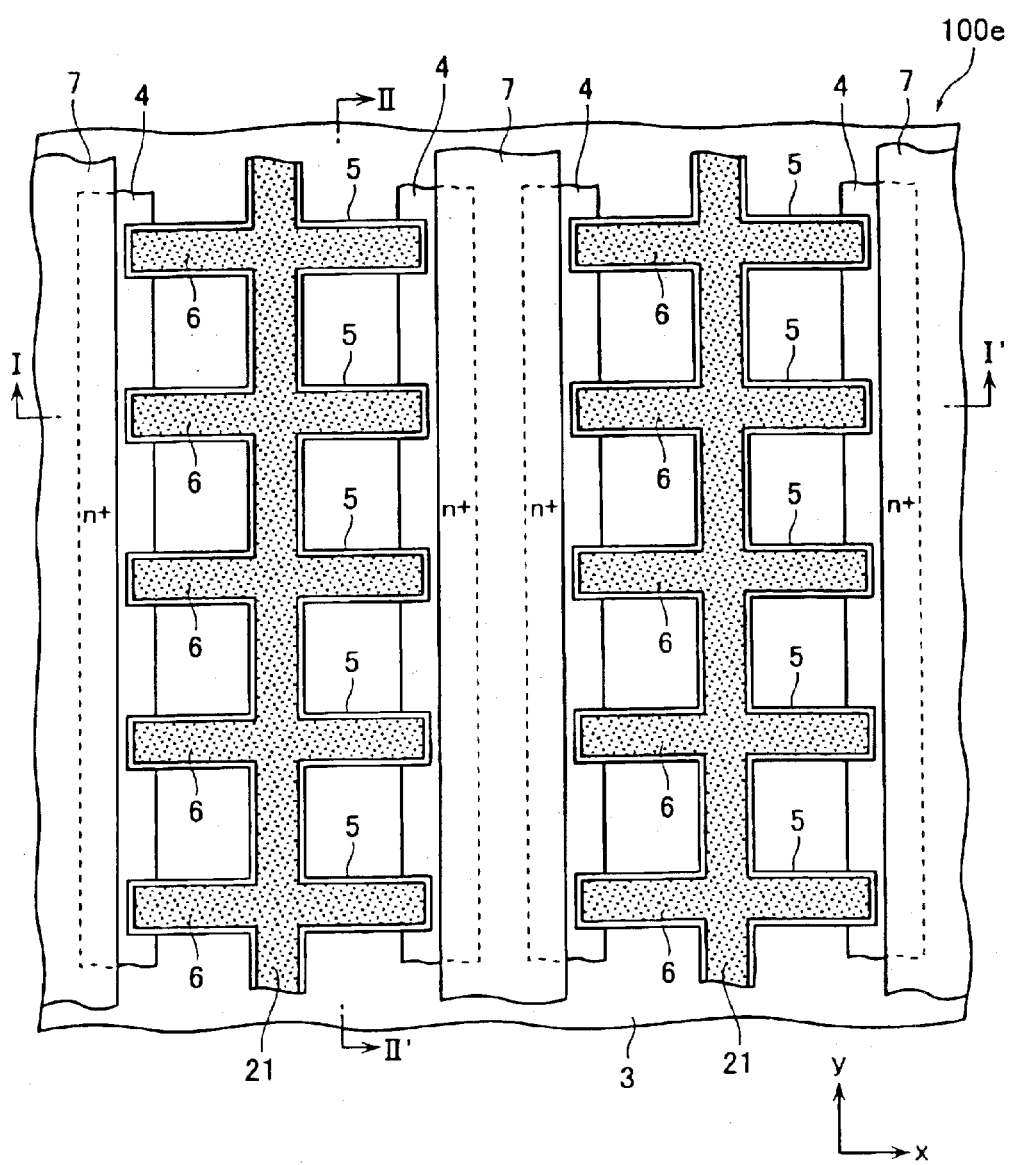

FIG. 10 depicts a plan view of main part of an IGBT 100e of Embodiment 5. Its I-I' and II-II' cross-sections are the same as those of FIGS. 2 and 3. In a similar manner shown in FIG. 6 of Embodiment 2, the cathode emitter layers 4 are formed as parallel elongate diffusion layers each of which continues to span and overlie a plurality of trench gates 6 in the y-direction. This embodiment is the same as that of FIG. 9 in that the coupler sections 21 are provided for coupling together the trench gates at their longitudinally central portions. For the purpose of lowering the gate lead resistance, it is also effective to form a metal wiring lead overlying each coupler section 21.

This structure is similar to Embodiment 2 except that the coupler sections 21 are provided; thus, similar effects to those of Embodiment 2 are obtainable.

Embodiment 6

Figure 11:
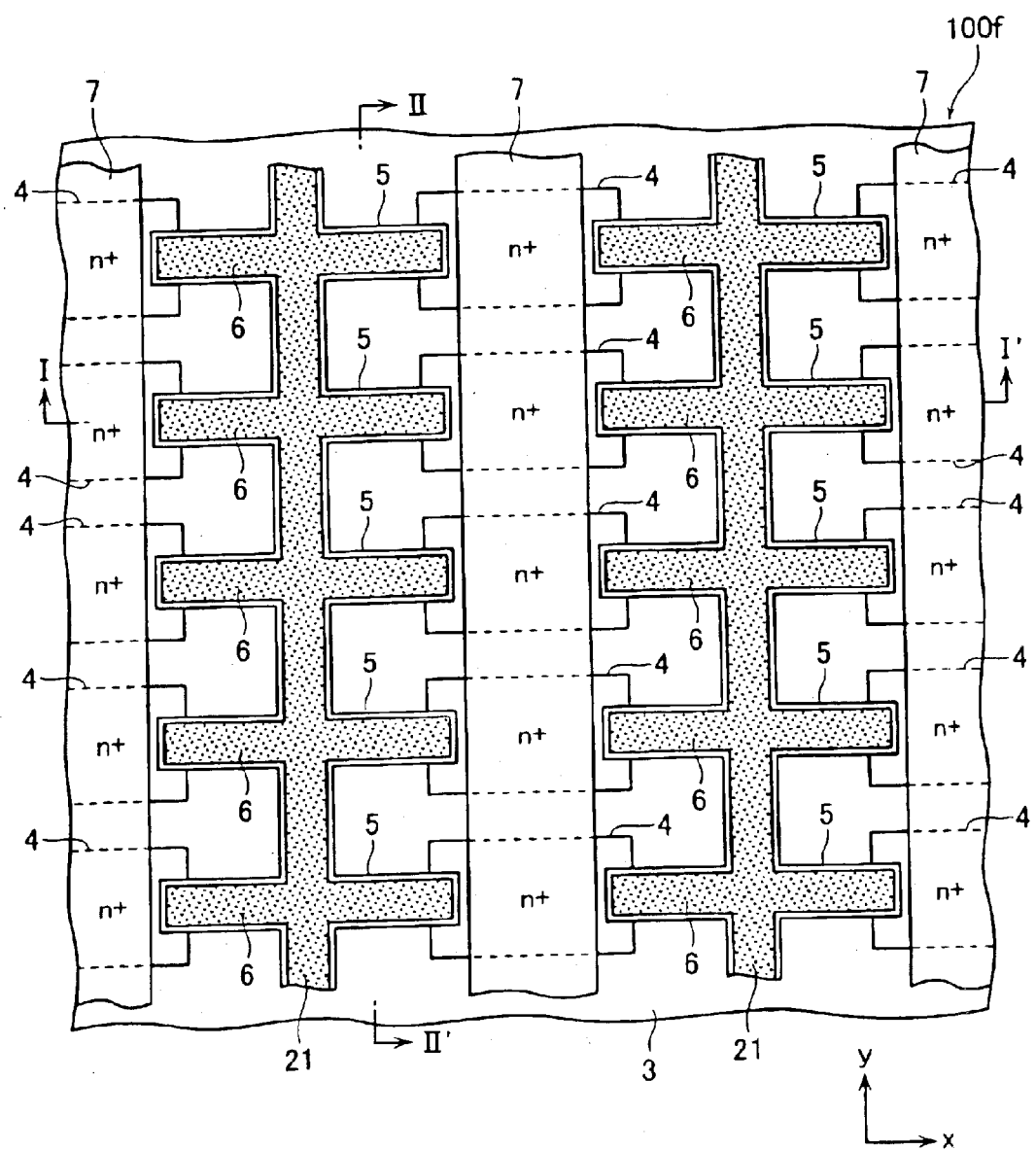

FIG. 11 shows a plan view of an IGBT 100f of Embodiment 6. Its I-I' and II-II' cross-sections are the same as those of FIGS. 8 and 3. In a similar manner to Embodiment 3 (FIGS. 7 and 8), the cathode emitter layers 4 are arranged so that adjacent ones are formed as a diffusion layer shared by neighboring insulated trench gates 6 in the x-direction. This embodiment is the same as that of FIG. 9 in that the coupler sections 21 are provided for coupling together the trench gates 6 at their central portions in the elongate direction thereof.

This structure is similar to Embodiment 3 except that the coupler sections 21 are provided; thus, similar effects to those of Embodiment 3 are obtainable.

Embodiment 7

Figure 12:
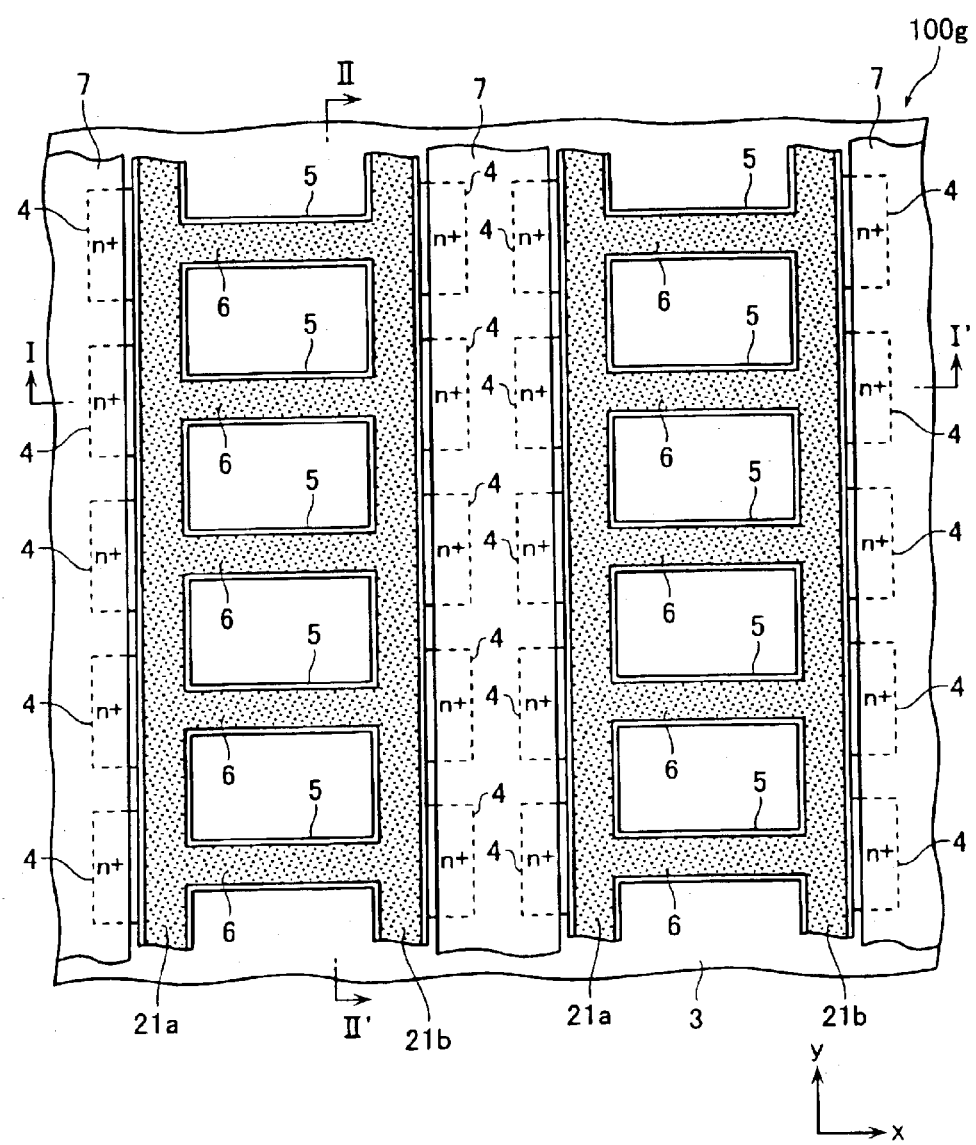

FIG. 12 is a plan view of an IGBT 100g of Embodiment 7. Its I-I' and II-II' cross-sections are the same as those shown in FIGS. 2 and 3. This embodiment is a modified one of the embodiment of FIG. 9, wherein coupling sections 21a, 21b are provided for coupling together a plurality of insulated trench gates 6 aligned in the y-direction at their both end portions in the elongate direction thereof. These coupler sections 21a, 21b have the same structure as the insulated trench gates 6 and are manufacturable by the same process and also the same as Embodiment 4 to 6 of FIGS. 9–11 in the scheme for connection of multiple trench gates 6. The cathode emitter layers 4 are impurity-doped diffusion layers or "islands" which are formed independently of one another at the both end portions of each trench gate in a similar way to that shown in FIG. 1 or FIG. 9.

Unlike the embodiments stated previously, this structure is not in the state that each cathode emitter layer 4 opposes three side faces of the edge of a trench gate associated therewith. However, since a part which underlies a portion of cathode emitter layer 4 that opposes the side faces of coupler sections 21a, 21b also becomes part of the channel region, it is possible to provide the required channel width comparable to that in Embodiment 1. Regarding the others, similar effects to those of Embodiment 1 are obtainable.

Embodiment 8

Figure 13:
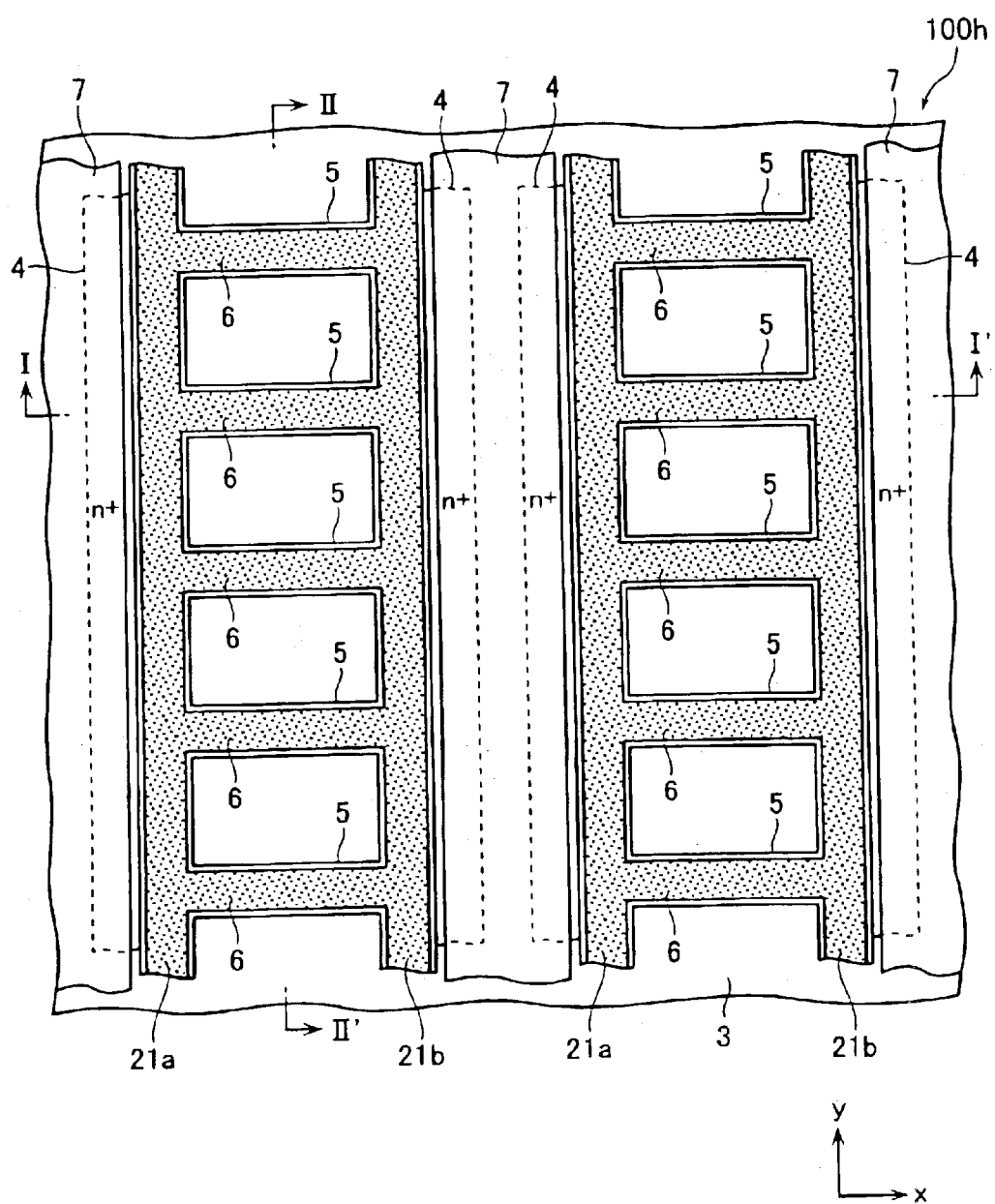

FIG. 13 is a plan view of an IGBT 10h of Embodiment 8. Its I-I' and II-II' cross-sections are the same as those shown in FIGS. 2 and 3. This embodiment is similar in trench gate structure to the embodiment of FIG. 12 while forming the cathode emitter layers 4 as diffusion layers each continuously spanning a plurality of trench gates 6 in the y-direction in a similar way to the embodiment of FIG. 6 or 10, in other words, as diffusion layers each continuing along the coupler sections 21a, 21b. According to this embodiment, entire parts of the couplers 21a, 21b of the trench gates 6 become effective gate electrodes with channel regions formed at or around the entire side faces thereof. With such an arrangement, it is possible to achieve the same channel width as that in the prior art of FIG. 15 or FIG. 17. Thus a sufficient current capacity is obtainable. Additionally, as in the embodiment of FIG. 6, large fabrication margins are obtained.

Embodiment 9

Figure 14:
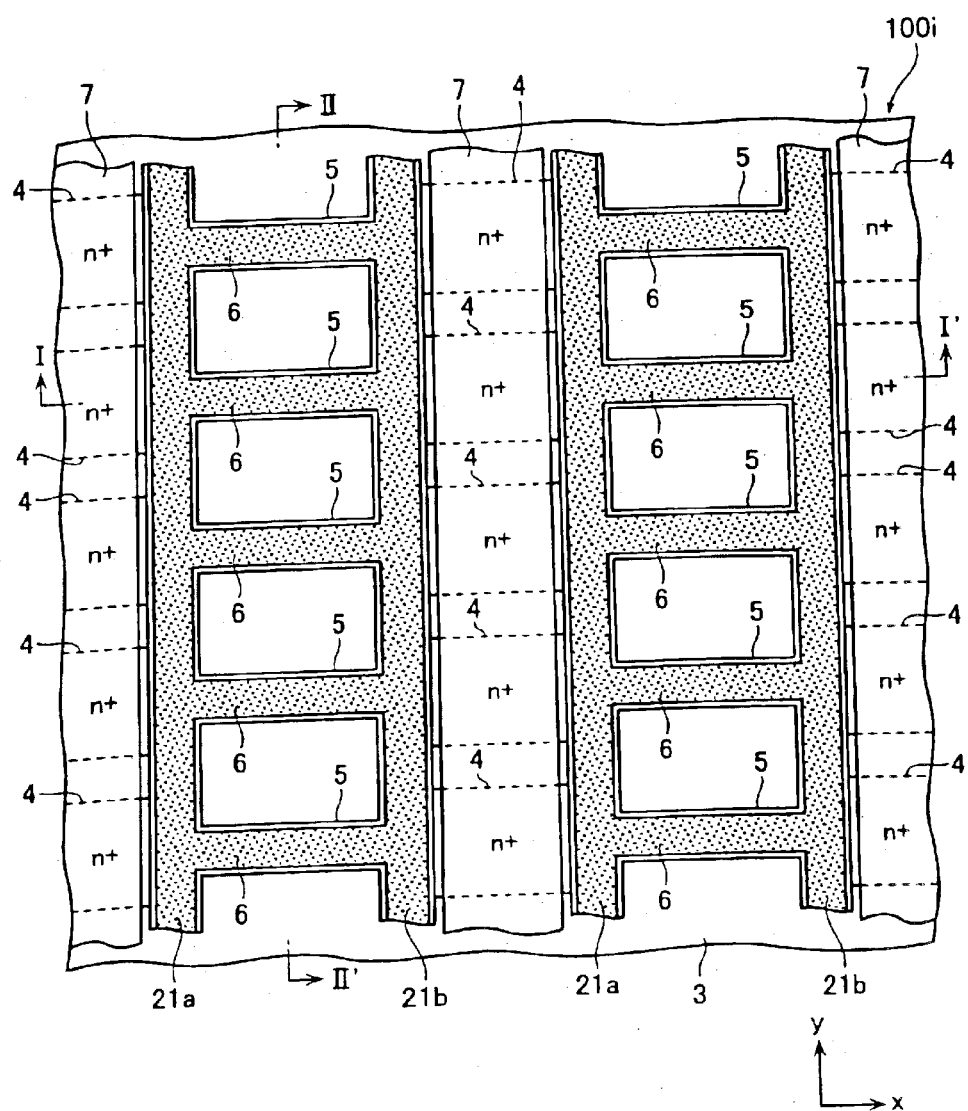

FIG. 14 is a plan view of an IGBT 100i of Embodiment 9. Its I-I' and II-II' cross-sections are the same as those of FIGS. 8 and 3. This embodiment is similar in trench gate structure to the embodiment of FIG. 12 with the cathode emitter layers 4 formed as impurity diffusion layers each of which is shared by two neighboring trench gates 6 in a similar manner to the embodiment of FIG. 7 or FIG. 11. For the same reason as the FIG. 7 embodiment, large fabrication margins are obtainable.

It has been stated that according to this invention, it is possible to provide an insulated gate bipolar transistor capable of obtaining low on-voltage characteristics without having to reduce manufacturing efficiencies.

What is claimed is:

1. An insulated gate bipolar transistor comprising:

a first semiconductor layer of a first conductivity type;

a second semiconductor layer of a second conductivity type formed on a top surface of said first semiconductor layer;

a base layer of the first conductivity type formed on a top surface of said second semiconductor layer;

a plurality of gate electrodes each of which is buried in a trench with a gate insulation film interposed therebetween, said trench being formed in said base layer to a depth reaching said second semiconductor layer from a surface of said base layer, each said gate electrode having an upper surface of a rectangular pattern with different widths in two orthogonal directions, said gate electrodes being disposed in a direction along a short side of the rectangular pattern;

emitter layers of the second conductivity type formed in the surface of said base layer to oppose both end portions of each said gate electrode in a direction along a long side of the rectangular pattern;

a first main electrode in contact with said emitter layers and said base layer; and a second main electrode formed at a bottom surface of said first semiconductor layer.

2. The transistor according to claim 1, wherein said emitter layers are formed as impurity diffusion layers opposing three side faces at the both end portions of each said gate electrodes in the long side direction.

3. The transistor according to claim 2, wherein said emitter layers are impurity diffusion layers formed independently of each other at the both end portions of each said gate electrode in the long side direction.

4. The transistor according to claim 2, wherein said emitter layers are impurity diffusion layers continuously formed to extend and between said plurality of isolated trench gates aligned in the short side direction thereof.

5. The transistor according to claim 2, wherein said gate electrodes include multiple ones aligned in the long side direction also, and wherein said emitter layers are impurity diffusion layers formed to continue between two neighboring gate electrodes while opposing respective end portions of said two neighboring gate electrodes in the long side direction.

* * * * *